United States Patent [19]

Sakamoto

[11] 4,387,443
[45] Jun. 7, 1983

[54] MAGNETIC BUBBLE DEVICE

[75] Inventor: Koji Sakamoto, Ibaragi, Japan

[73] Assignees: Agency of Industrial Science and Technology; Ministry of International Trade and Industry, both of Tokyo, Japan

[21] Appl. No.: 246,251

[22] Filed: Mar. 23, 1981

[30] Foreign Application Priority Data

Apr. 14, 1980 [JP] Japan .................................. 55-48965
May 30, 1980 [JP] Japan .................................. 55-72218

[51] Int. Cl.³ ............................................ G11C 19/08
[52] U.S. Cl. ........................................ 365/19; 365/57
[58] Field of Search ........................ 365/19, 20, 21, 57

[56] References Cited

U.S. PATENT DOCUMENTS 3,893,089 7/1975 Almasi .................................. 365/41
4,187,555 2/1980 Bobeck .................................. 365/19
4,314,358 2/1982 Bobeck .................................. 365/19

*Primary Examiner*—James W. Moffitt

*Attorney, Agent, or Firm*—Oblon, Fisher, Spivak, McClelland & Maier

[57] ABSTRACT

A dual-conductor type current-access magnetic bubble device comprises apertured conductors on which apertured magnetic sheets having the same configuration as the corresponding conductors are disposed, whereby magnetic poles are induced on each aperture of the magnetic sheets by the in-plane magnetic field generated by the current applied to the corresponding conductors to reduce the driving current required for bubble propagation, while stable regions are formed in the substrate by the magnetic poles induced by the bubbles at the boundaries of the apertures of the magnetic sheets at the time of service interruption. The device is further provided with a magnetic rail having side walls on which magnetic poles are induced by the stray flux of the bubbles in the substrate, thereby to have stable bubble-rest regions formed in the substrate at the time of service interruption by the magnetic poles induced on the walls.

8 Claims, 14 Drawing Figures

MAGNETIC BUBBLE DEVICE

BACKGROUND OF THE INVENTION

The present invention relates to a current-access magnetic bubble device of dual-conductor type which has a propagation path capable of carrying out bubble propagation using a low driving current and is capable of stable retention of bubbles even when the current is off.

Magnetic bubble devices are expected to provide high-performance, high-density, low-cost, and non-volatile memories. Among these devices, the current-access device not only provides better performance enhancement but also is more economical than the field-access device. Further, the current-access device of dual-conductor type enjoys an inherent superior feature over single-conductor current-access devices which are inferior in design flexibility.

However, the current-access magnetic bubble devices dissipate excessive power due to the direct application of a driving current to the conductor pattern, and consequently, generate too much heat to permit a high-bit-density memory.

While magnetic bubble devices are characterized by non-volatility, i.e. the stored information remains in the memory even if the driving current is removed, the conventional propagation circuit cannot reliably retain bubbles in a stable condition when the driving current is off, and as a result, bubbles may sometimes divert from the regular propagation path under disturbance. This may cause distortion or drop out of the recorded information.

Techniques intended to enhance the performance, versatility and functional capabilities of magnetic bubble devices have been described in many reference materials such as: "Current-Access Magnetic Bubble Circuits" on pp. 1453–1540 in the Bell System Technical Journal, Vol. 58, No. 6, July–August 1979, published by American Telephone and Telegraph Company.

There has been proposed another method of reducing the driving current by providing a permalloy keeper on the conductor (the third layer) of a current-access device, but no report of a device embodying the method has been disclosed to date (paper titled "Can Perforated-Sheet Devices Be Scaled Down From 2 to 0.5 Micron Lithography" presented by B. S. Han et al. at the International Conference on Magnetic Bubbles. ICMB-4, Sept. 26, 1980.)

SUMMARY OF THE INVENTION

The object of the present invention is to provide a current-access magnetic bubble device comprising a dual-conductor having a highly reliable propagation path structure, whereby bubbles can be propagated by a low driving current, i.e. with low power consumption, and recorded information can be stored in a stable condition even when the driving current is cut off.

To achieve this object, in a magnetic bubble device comprising a substrate for carrying magnetic bubbles and first and second conductors each having serially arrayed apertures each disposed at a fixed pattern period such that each aperture in one of the conductors is shifted relative to the corresponding aperture in the other conductor to form a bit pattern, the improvement wherein apertured magnetic sheets each having the same configuration at the corresponding conductor are disposed on the surfaces of respective conductors and/or a magnetic rail is disposed along the bubble propagation path is achieved.

Since the magnetic sheets are provided on the first and the second conductors, a magnetic pole is induced at the peripheries of the apertures of the magnetic sheets are due to the in-plane field formed by each of the said conductors, and the magnetic field generated by the magnetic pole enhances bubble propagation, whereby the driving current for the propagation is reduced to suppress heat generation, and a high density magnetic bubble device can be realized.

On the other hand, a magnetic rail is formed between the substrate and the first conductor or on the second conductor, and even when the driving current is off, magnetic bubbles in the substrate reside stably at regular positions of the propagation path with the aid of the magnetic poles induced in this magnetic rail by the magnetic bubbles, whereby the bubbles will not be diverted from the regular propagation path under the influence of a disturbance during service interruption.

Another purpose and feature of the present invention will be described hereinafter with reference to the attached drawings.

DESCRIPTION OF THE PREFERRED EMBODIMENTS

The present invention relates to a dual-conductor type magnetic bubble device provided with a modified propagation path capable of reducing the driving current and retaining bubbles stably even in case of service interruption.

Figure 1:
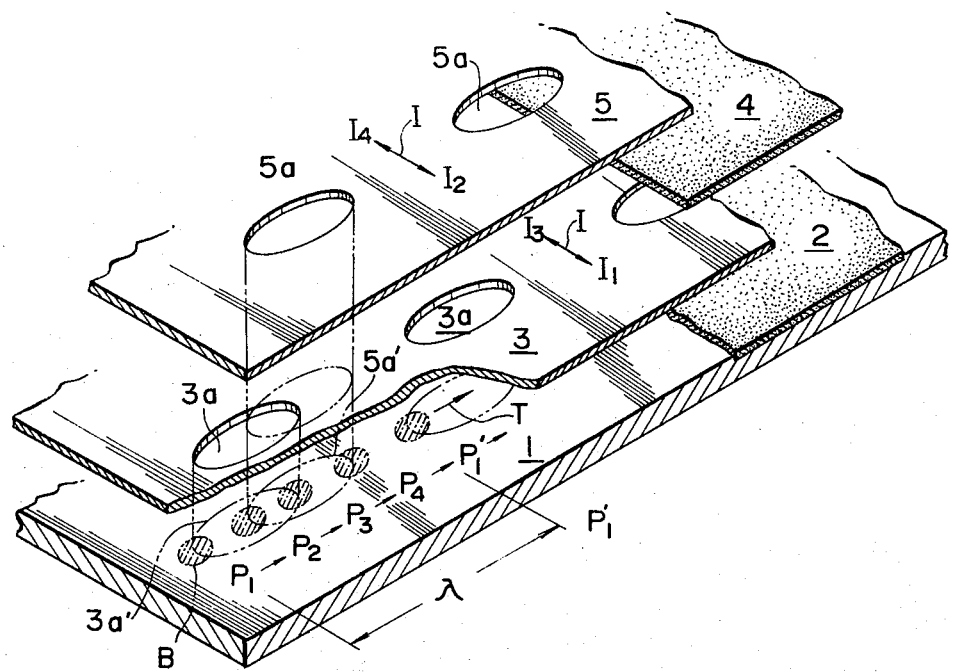
FIG. 1 is an exploded perspective view of the propagation circuit of a conventional dual-conductor type current-access magnetic bubble device.

First, the description starts with FIG. 1 which schematically illustrates one example of the conventional dual-conductor type current-access magnetic bubble device.

The first conductor 3 is applied via a spacer 2 directly on a substrate 1 made of a material such as garnet for sustaining magnetic bubble B and further the second conductor 5 is applied directly on the first conductor 3 via an insulating spacer 4. Series of apertures 3a and 5a are respectively disposed in the first conductor 3 and in the second conductor 5 and the apertures in each conductor are arrayed at a fixed pattern period λ (which is determined by the characteristics of the substrate and is usually 4 times the bubble diameter) in the direction of bubble propagation as indicated by the arrow T. The paired apertures 3a and 5a of the first and second conductors constitute one bit. These are overlapped (the overlap length thereof is usually λ/4) as indicated by virtual lines 3a' and 5a' projected on the substrate 1 in FIG. 1.

In addition, the spacer 2 disposed on the substrate 1 is not necessarily required but is used for preventing the substrate 1 from suffering erosion when the first conductor 3 is formed by means of chemical etching or sputter etching.

Figure 2:
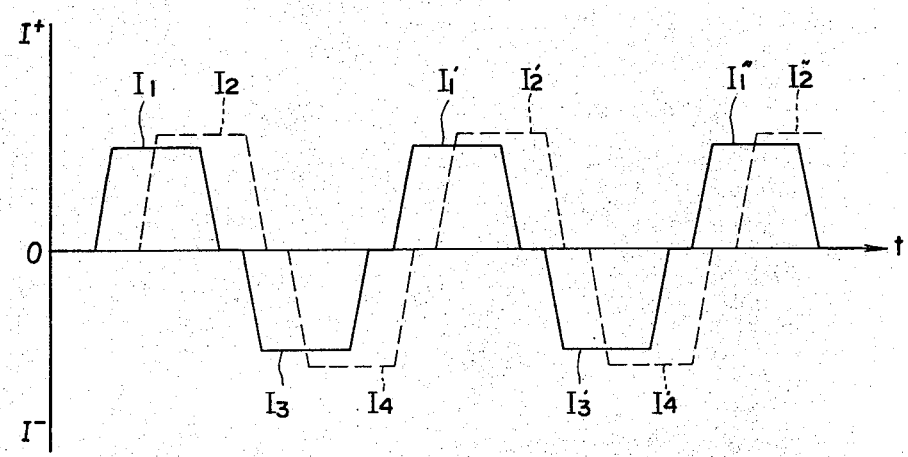
FIG. 2 is a current sequence for bubble propagation in the device of FIG. 1.

In the bubble propagation path thus formed, bipolar current pulses $I_1$ and $I_3$ are applied to the first conductor 3 in the direction perpendicular to the bubble propagation direction T and pulses $I_2$ and $I_4$ are applied to the second conductor 5 in a sequence as shown in FIG. 2, whereby the said magnetic bubble is driven sequentially through rest points (or potential wells $P_1$ $P_2$ $P_3$ $P_4$ $P_1'$ . . . in response to pulse sequence $[I_1I_2I_3I_4I_1' \ldots ]$.

Although this propagation mechanism will be described with reference to FIG. 3 with respect to the first conductor 3 for ease of understanding, the same phenomenon occurs with respect to the second conductor 5. When current pulse $I^+$ is applied to the conductor 3 in the direction (as indicated by the arrow in the figure) perpendicular to the bubble propagation direction, the perpendicular magnetic field $\overline{H}\perp$ having an intensity as shown by the waveform in the diagram is produced in the substrate, where the intensity of the perpendicular field $\overline{H}\perp$ corresponds to the average with respect to the thickness of the substrate. On the other hand, in the upper and lower surface portions of the conductor are generated respectively in-plane fields $H\|$ and $H\|'$ each having an intensity as indicated by the waveform in the figure. Since a bubble has only a perpendicular magnetization and, an in-plane field does not contribute to bubble propagation, only the perpendicular field $\overline{H}\perp$ is effective for bubble propagation.

Figure 3:
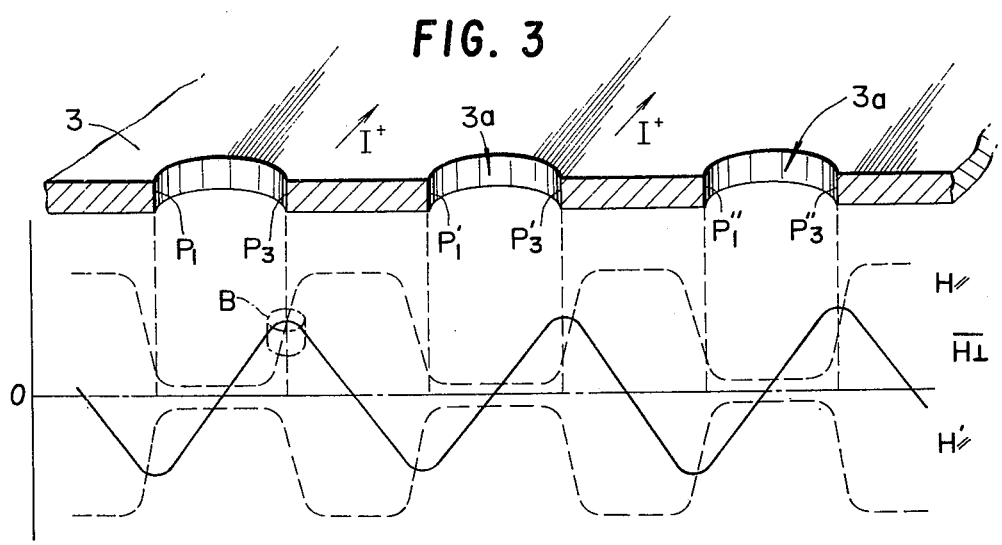
FIG. 3 is an explanatory diagram showing the propagation mechanism for one of the conductor propagation circuit in FIG. 1.

In other words, assuming the bubble magnetization is directed downwardly and current pulse $I^+$ (corresponding to $I_1$, $I_1' \ldots$ in FIG. 2) is applied to the conductor 3 in the direction indicated by the arrow in FIG. 3, peak intensities of $\overline{H}\perp$ appear at positions $P_3$, $P'_3$, $P''_3$ . . . while the lowest intensities of $\overline{H}\perp$ appear at positions $P_1$, $P'_1$, $P''_1$ . . . , whereby virtually indicated bubble B placed at a position such as $P_3$ is shifted to the position corresponding to either one of the adjacent lowest intensities. Since it is unpredicable to which adjacent position the bubble will be shifted in case of a single conductor, such a dual-conductor structure as shown in FIG. 1 where apertures 3a and 5a are overlapped is employed in the device, wherein peak and lowest intensities are moved when current pulse $I_2$ ($I'_2$ . . .) is applied to the conductor 5 such that the peak intensities are formed at $P_4$, $P'_4$ . . . and the lowest intensities are formed at $P_2$, $P'_2$ . . . , and then, when subsequent pulse $I_3$ ($I'_3$ . . .) is applied to the conductor 3 the peak and lowest intensities are formed at $P_1$, $P'_1$, . . . and $P_3$, $P'_3$ . . . and further subsequent pulses are applied to move those intensities to the next points successively.

The preceding describes the propagation mechanism for the ordinary dual-conductor type current-access device on which the present invention is based. This current-access device is large in power loss when used on a memory chip compared with the field-access device. The present invention, therefore, is directed to reduction of the driving current using the structure described below, whereby a low-power-consuming current-access device has been developed.

Figure 4:
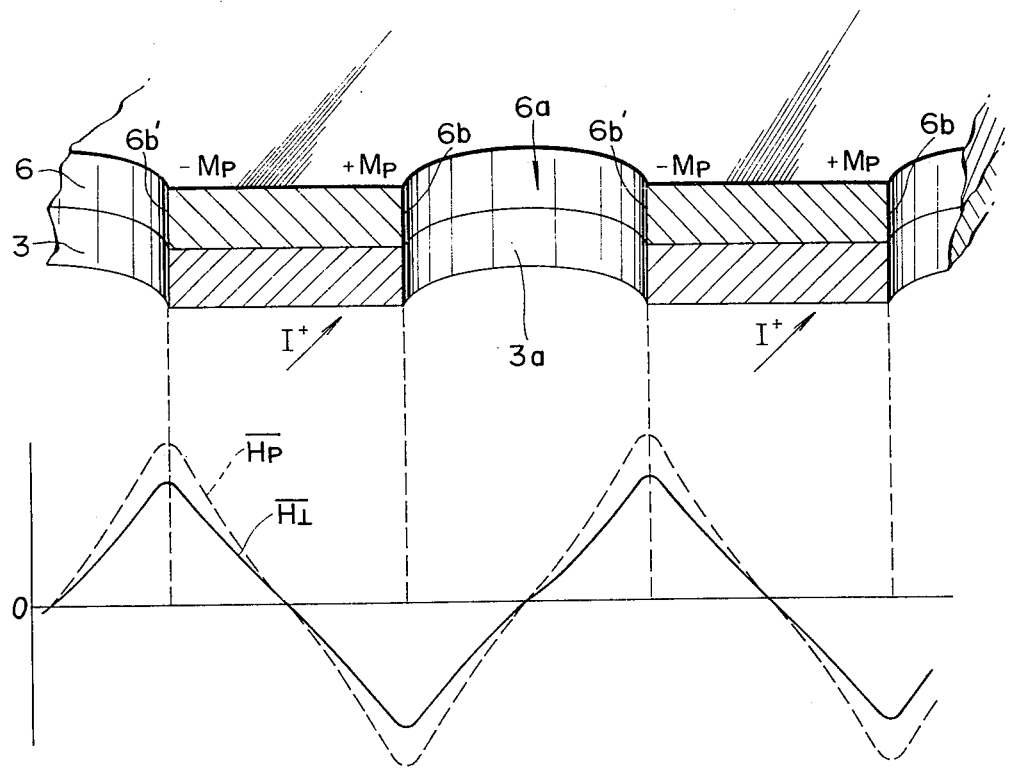
FIG. 4 is an illustration showing the propagation mechanism for the conductor propagation circuit with the magnetic sheet according to the present invention.

In the present invention, apertured magnetic sheets having the same plane configurations as the corresponding conductors are disposed on the respective upper surfaces of the first and second conductors. Thus, the in-plane field $H\|$ in the upper portion of each conductor induces a magnetic pole in the edge of the aperture in the magnetic sheet of which position and shape are in agreement with the aperture in the conductor and the induced magnetic pole generates a perpendicular field in the substrate, resulting in reduction of the bubble driving current. Describing the effect of only the conductor 3 shown in FIG. 3, the apertured magnetic sheet 6 is disposed, as shown in FIG. 4, on the upper surface of the conductor 3 such that aperture 6a agrees with aperture 3a of the conductor. Applying current $I^+$ to the conductor 3 in the arrow direction, the in-plane magnetic field is generated in the right direction on the upper part of the conductor and in the left direction on the lower part of the conductor, thereby causing the magnetic sheet 6 on the upper surface of conductor sheet 3 to be magnetized in the right direction and magnetic poles $+M_p$ and $-M_p$ to be induced in the peripheries (the side walls) 6b and 6b' of aperture 6a. These magnetic poles $+M_p$ and $-M_p$ generate perpendicular magnetic field $\overline{H}p$ (corresponding to the average with respect to the thickness of the substrate which, as indicated by the diagram in FIG. 4, is in the same phase as the perpendicular field $\overline{H}\perp$ generated in the substrate by current $I^+$ applied to conductor 3. What should be noted here is that if the magnetic sheet 6 is attached to the lower surface of the conductor (the surface facing the substrate), the perpendicular fields $\overline{H}p$ and $\overline{H}\perp$ become opposite to each other with respect to polarity, thereby causing the fields to be canceled.

A stated so far, the bubble driving power according to the present invention will be increased by the magnitude of the perpendicular field $\overline{H}p$ generated by the magnetic poles $+M_p$ and $-M_p$ induced in the side walls 6b and 6b' of aperture 6a of the magnetic sheet. In other words, if only the conventional driving power is required, the perpendicular field $\overline{H}\perp$, that is, current $I^+$, can be reduced by a magnitude equivalent to the perpendicular field $\overline{H}p$.

Figure 5:
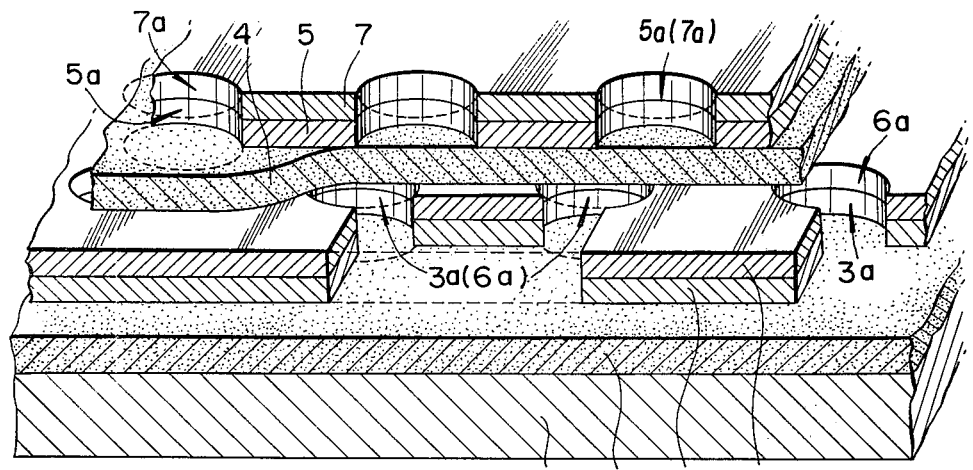
FIG. 5 is a sectional perspective view of the propagation circuit of a device according to the first embodiment of the present invention.

The same effect can be obtained even when the current $I^+$ is reversed to $I^-$ and the polarity of the perpendicular field $\overline{H}\perp$ is made reverse to the one indicated in the figure, since the reversal of the polarity of $\overline{H}\perp$ is accompanied by the reversal of the polarity of the perpendicular field $\overline{H}p$ generated by the magnetic sheet. FIG. 5 shows schematically the structure of the device in which first and second magnetic sheets 6 and 7 are disposed on the first and second conductors 3 and 5. Describing the structure in more detail, the first magnetic sheet 6 is applied directly on the first conductor 3 disposed on substrate 1 via the insulating spacer 2, the first conductor 3 and the first magnetic sheet 6 together forming a first composite layer. Next, the second conductor 5 is applied on the first composite layer via insulating spacer 4 and further the second magnetic sheet 7 is applied on the said second conductor 5, the second conductor 5 and the second magnetic sheet 7 together forming a second composite layer. The first and second magnetic sheets 6 and 7 are provided with apertures 6a and 7a, respectively, whose locations and shapes are respectively the same as apertures 3a and 5a which are disposed in a prescribed relationship respectively in the first and second conductors 3 and 5 located directly under the first and second magnetic sheets 6 and 7. Since the magnetic sheets 6 and 7 may be made very thin and, therefore, are hardly influenced by the perpendicular field, the distribution of induced magnetic pole Mp can be obtained from the magnetic properties of the magnetic sheets, the shape and dimensions of aperture patterns, and the in-plane field H ||, and the perpendicular field Hp can be obtained from the distributin of Mp, the thickness of the substrate, and the distance between the substrate and the magnetic sheet.

Also, magnetic poles are induced in the magnetic sheets 6 and 7 by the bubbles in the substrate, which hinders smooth bubble propagation due to magnetic attraction if the induced magnetic pole is excessively large. Since this induced magnetic pole can be controlled by the spacer thickness between the substrate and the magnetic sheet 6 (the combined thickness of spacer 2 and the conductor), appropriate control of the spacer thickness makes it possible to secure not only smooth bubble propagation but also relatively stable retention of information because the induced magnetic pole attracts the bubble at the proper position even if a disturbance occurs during the driving current cut-off. In this instance, the bubble induces a magnetic pole also on the side walls 7b and 7b' of the magnetic sheet 7 of the second composite layer, but the induced magnetic force between the bubble and the induced magnetic pole is relatively small as the distance of the second composite layer from the substrate is greater than that of the first composite layer. Accordingly, the reliability of information retention can be enhanced by placing bubbles at the positions $P_1$, $P'_1$ ..., i.e. the positions under the aperture side walls of the first composite layer, while the memory operation is stopped.

In addition, the thicknesses of the insulating spacers 2 and 4 in the embodiment shown in FIG. 5 are determined so that the in-plane field generated in the magnetic sheet 6 by the conductor 3 is much greater than that generated in the magnetic sheet 6 by the bubble and than that generated in the magnetic sheet 6 by the conductor 5.

As mentioned in the preceding paragraphs, according to the present invention the current necessary for bubble propagation can be reduced, and consequently, the heat dissipated from the propagation path can be decreased. Thus, highly reliable bubble propagation can be realized without destroying the characteristics of the bubbles. Although relatively stable retention of bubbles is possible even at the time of service interruption since attraction takes place between the bubbles and the magnetic poles induced in the magnetic sheets due to the stray flux of the bubbles, the bubbles, especially in the conventional device, may be diverted from the regular rest points. To prevent this worst situation the following embodiments employ structures that can retain bubbles at regular positions stably.

As an example, in FIG. 1 when a driving current is applied to conductors 3 and 5 in such sequence as shown in FIG. 2, a bubble on the propagation path T is propagated to rest points $P_1$, $P_2$, $P_3$, ..., sequentially, whereas the said rest points will lose the function of maintaining the bubble stably when the driving current is cut off. The bubble B under such condition will divert from the regular propagation path where the bubble ought to be located when any disturbance acts on it, resulting in distortion and dropout of stored information when operation is resumed later on.

Now, according to the present invention, as will be described in detail hereinafter, a magnetic rail made of magnetic material such as permalloy is disposed along the propagation path in order to cause the stray flux of the bubble to induce a magnetic pole on the wall of an aperture formed in this rail.

Figure 6:
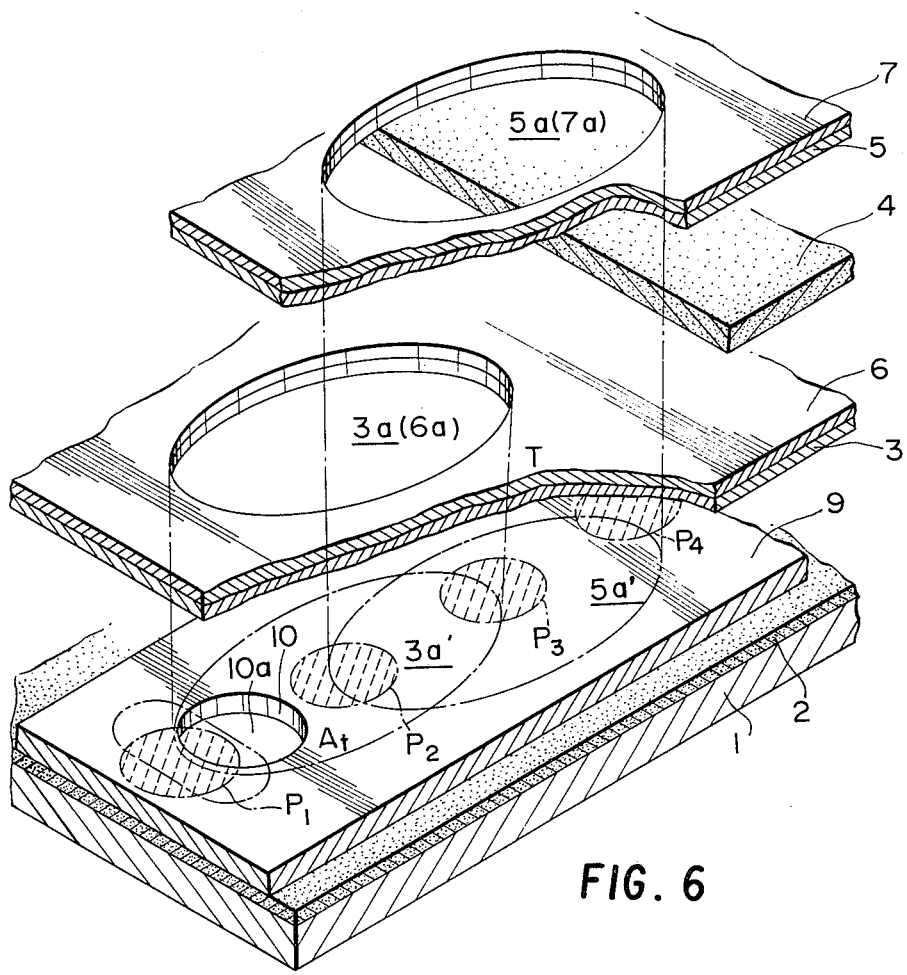
FIGS. 6, 7, and 8 are an exploded perspective view, exploded perspective view, and partially sectioned perspective view of a device according to the second embodiment of the present invention.
Figure 7:
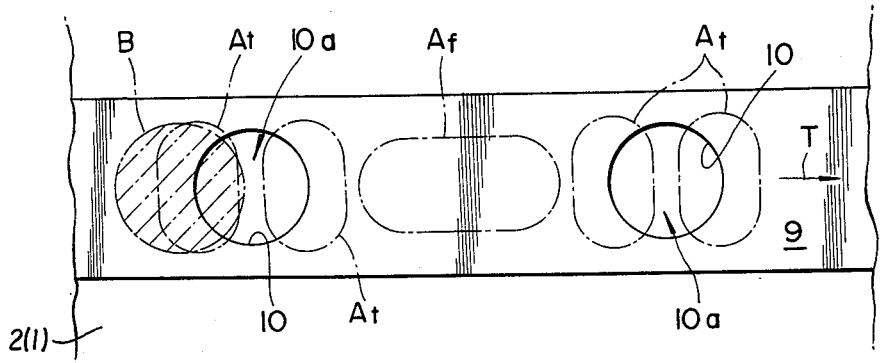
Figure 8:
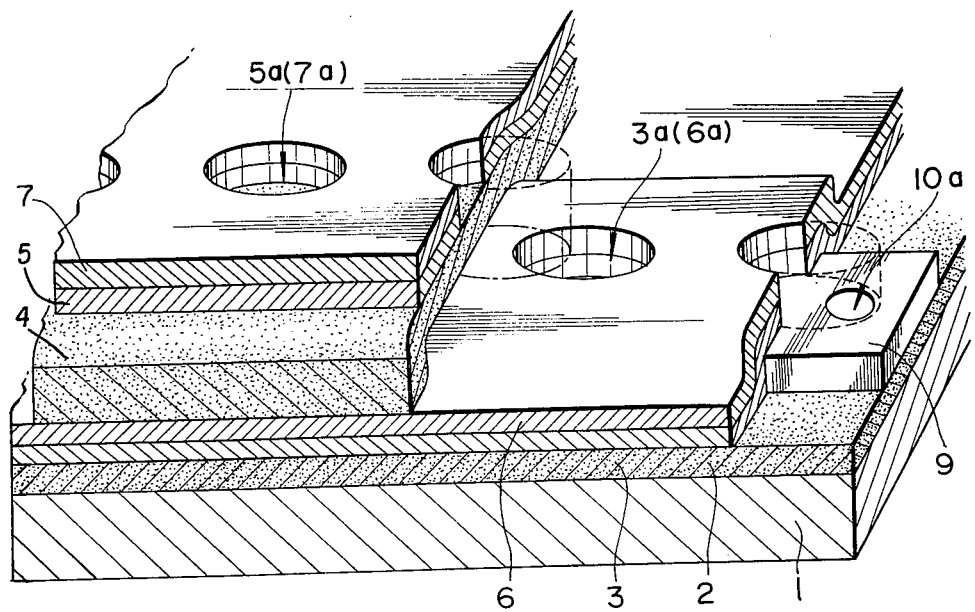

In one embodiment as shown in FIGS. 6, 7, and 8, a magnetic rail 9 made of high-permeability material is disposed on the substrate 1 preferably via the spacer 2 along the propagation path T. The first composite layer consisting of the first conductor 3 and the magnetic sheet 6 and the second composite layer consisting of the spacer 4, the second conductor 5, and the magnetic sheet 7 are sequentially stacked on the magnetic rail 9.

In the rail 9, apertures 10a having side walls 10 in each of which a magnetic pole will be induced by the bubble B are disposed. As shown in FIGS. 6 and 7, by providing the side walls 10 rising from the substrate 1 on the rail 9, a magnetic pole is induced in these side walls by the bubble B, whereby the induced magnetic pole attracts the bubble B and, as a result, the bubble B is kept in region $A_t$ in the neighborhood of the side walls 10. Accordingly, the bubble B residing at this region will not divert from the propagation path even if affected by a disturbance when the driving current is off.

On the other hand, if the bubble in the region $A_f$ between the apertures of the rail is affected by the disturbance, this will not return to the region $A_f$ even after the disturbance is removed. In other words, region $A_t$ is a stable area, while region $A_f$ is an unstable area. Now, if this stable region is disposed so as to include a point on the propagation path where one wishes to hold a bubble at the time of service interruption, that is, one of the said rest points from $P_1$ to $P_4$, the bubble propagation to be resumed after the current comes on again is not hindered, even when the bubble is moved to an undesirable region due to the occurrence of a disturbance at the time of service interruption, since the bubble will be returned to the stable region by the magnetic pole induced by the bubble when the disturbance is removed. Namely, because the point on which the bubbles rest at the time of service interruption can be determined, the later processing can be started without any delay after an application of current is recovered.

Figure 9A:
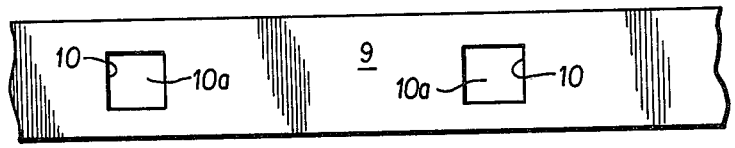
FIGS. 9A to 9E show further embodiments of the magnetic rail used in the second embodiment of the present invention.
Figure 9B:
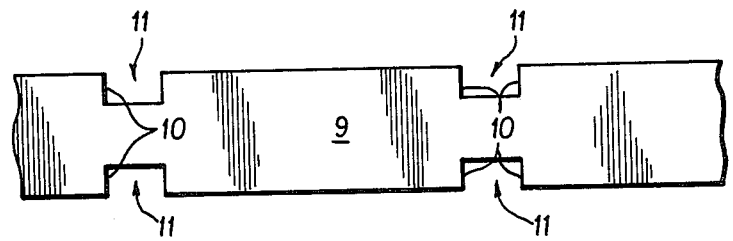
Figure 9C:
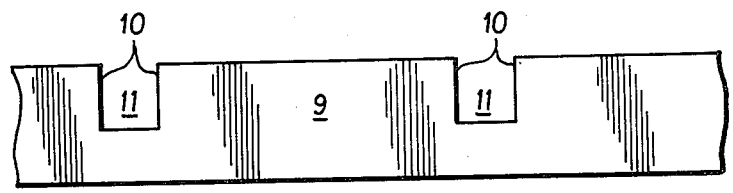
Figure 9D:
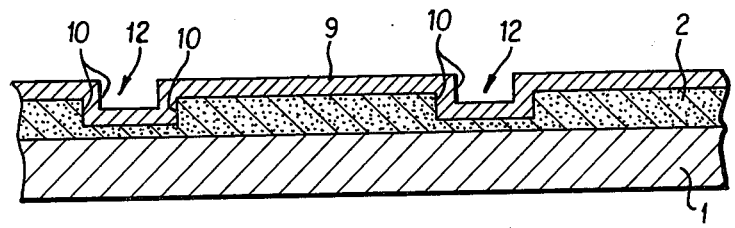
Figure 9E:
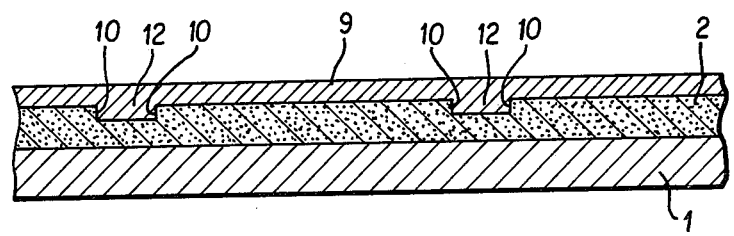

In addition, though FIG. 6 shows only one aperture 10a, it is apparent that a plural number of apertures should be placed corresponding to the prescribed positions $P_1$, $P'_1$, ... for retaining all the bubble bits in the same way as described above. It is needless to say, however, that any hindrance to the propagation due to an attractive force for keeping the bubble B in the stable domain $A_t$ which is too intensive must be avoided under the normal propagation mode. Moreover, the problem of the self-rest of bubble B at the time of service interruption while securing normal operation in accordance with a sequence of the usual current pulses, $I_1$ to $I_4$, can be resolved easily by selecting an appropriate thickness for the rail 9 or thickness for the spacer 2 if it is used, that is by selecting the height of spacing between the substrate 1 and the rail 9, because the induced magnetic pole can be controlled by such selection. Accordingly, various modified embodiments of the magnetic rail can be provided on condition that the aperture side wall is so designed that the magnetic pole induced therein by the bubble does not hinder normal propagation but that it produces magnetic force enough to permit the bubble to rest within the stable region $A_f$ at the time of service interruption when the composite layers do not induce sufficient magnetic poles. For example, the aperture 10a to be disposed in magnetic rail 9 is not restricted in shape but may be the same as aperture 3a shown in FIG. 6, may be a rectangle as shown in FIG. 9A, or may be of some other shape. Further, the aperture 10a need not be a through hole but may be a blind hole. Furthermore, as shown in FIGS. 9B and 9C, both or either side or rail 9 may be notched to use the side of the notched section 11 as the wall section 10, or as shown in FIGS. 9D and 9E dents or the projections are formed in the rail disposed on the insulating spacer 2 to use the sides of the dents or the projections as a wall section for inducing magnetic poles.

While the aforementioned side wall 10 was described as being formed perpendicularly to substrate 1, the wall 10 need not necessarily be perpendicular to the substrate but may be slanted insofar as the aforementioned magnetic pole can be formed in the side wall. When not perpendicular, the required magnetic force can be controlled by adjusting the inclination. Further, although in FIG. 6 the magnetic rail 9 is disposed between the insulating spacer 2 and the conductor 3, the same effect as mentioned above can also be obtained by disposing the magnetic rail 9 between the first composite layer (3 and 6) and the second composite layer (5 and 7) or on the second composite layer (5 and 7) if the side wall 10 is heightened to obtain a magnetic force induced by the bubble, which is strong enough to meet the aforementioned requirements, thus satisfying the concept of the present invention. An example of the latter case is illustrated in FIG. 10.

Figure 10:
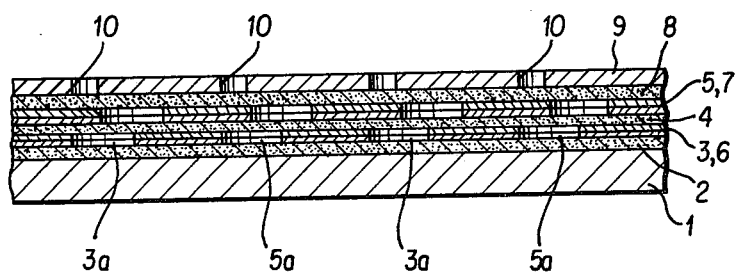
FIG. 10 is a sectioned side view of a device according to the third embodiment of the present invention.

In addition, in FIG. 10, insulating layer 8 is disposed between the magnetic rail 9 and the second composite layer (5 and 7), which is a preferred modification for preventing power loss caused by the current bypassing the magnetic rail 9. Particularly, when the magnetic rail 9 is disposed as the uppermost layer, a considerable thickness is required for the side wall 10 to generate the magnetic pole having the aforementioned necessary and sufficient magnetic force induced by the bubble, and, as a result, the resistance of the magnetic rail 9 decreases and when the rail 9 is applied directly on the second composite layer (5 and 7) there is the likelihood of a considerable power loss, so that the provision of insulating layer 8 is preferred.

However, as illustrated in FIG. 6, when the rail is disposed immediately above the substrate 1 in the current-access device structure, the magnetic rail 9 becomes considerably thin and as a consequence the resistance of the rail becomes large, whereby it is possible to keep the power loss negligibly small even when the rail is disposed close to the neighboring first composite layer (3 and 6). In this sense, an insulator is omitted between the rail and the first composite layer, but an insulator may be provided if necessary.

As described so far, according to the present invention the provision of the magnetic sheet on the first and second conductors can reduce the current necessary for bubble propagation and can decrease the heat dissipation due to power consumption, whereby the device attains high reliability and becomes suitable for the high density packaging now in demand. Moreover, the provision of the magnetic rail makes the device capable of carrying out highly reliable retention and recording of information.

What is claimed is:

1. In a current-access magnetic bubble device of a dual-conductor type comprising a substrate for carrying magnetic bubbles and first and second conductors each having apertures arranged serially therein disposed on said substrate and capable of propagating said magnetic bubbles sequentially along a propagation path composed of said apertures in the said first and second conductors upon application of a current to the first and second conductors in accordance with a prescribed sequence, the improvement wherein the magnetic bubble device comprises two magnetic sheets disposed one on the surface of each of said first and second conductors facing away from the substrate, said magnetic sheets being respectively provided with apertures having the same shape and configuration as those of said conductors, whereby magnetic poles are induced at the edges of said apertures in said magnetic sheets by the stray flux of the bubble in the substrate and/or by the application of the current to said conductors.

2. A magnetic bubble device as set forth in claim 1, further comprising a magnetic rail having apertures, the side walls of each of which has magnetic poles induced therein by the stray flux of a magnetic bubble in the substrate, said magnetic rail being disposed immediately above the substrate, whereby a stable region at which the bubble stably rests at the time of service interruption is formed on said substrate by the magnetic poles induced on said side wall of said magnetic rail.

3. A magnetic bubble device as set forth in claim 1, further comprising a magnetic rail having apertures the side wall of each of which has magnetic poles induced therein by the stray flux of a magnetic bubble in the substrate, said magnetic rail being disposed on said second conductor, whereby a stable region at which the bubble stably rests at the time of service interruption is formed on said substrate by the magnetic poles induced on said side wall of said magnetic rail.

4. A magnetic bubble device as set forth in claim 2 or 3, wherein said side walls are surfaces standing perpendicularly or at an angle to said substrate.

5. A magnetic bubble device as set forth in claim 4, wherein the apertures in said magnetic rail are circular.

6. A magnetic bubble device as set forth in claim 4, wherein the apertures in said magnetic rail are rectangular.

7. A magnetic bubble device as set forth in claim 2 or 3, wherein said side walls are formed by making notches on the edge of said magnetic rail.

8. A magnetic bubble device as set forth in claim 2 or 3, wherein said side walls are formed by providing dent or projection in said magnetic rail.

* * * * *